United States Patent [19]

Englund, Jr.

[11] Patent Number: 4,506,233
[45] Date of Patent: Mar. 19, 1985

[54] BANDWIDTH CONTROL CIRCUIT FOR A PHASE LOCKED LOOP

[75] Inventor: Arvid E. Englund, Jr., Lynchburg, Va.

[73] Assignee: General Electric Company, Lynchburg, Va.

[21] Appl. No.: 392,566

[22] Filed: Jun. 28, 1982

[51] Int. Cl.³ .............................................. H03L 7/10
[52] U.S. Cl. ...................................... 331/17; 331/25; 331/DIG. 2
[58] Field of Search ............ 331/1 R, 17, 25, DIG. 2; 455/266

[56] References Cited

U.S. PATENT DOCUMENTS 4,410,861  10/1983  Werner ...................... 331/DIG. 2 X

FOREIGN PATENT DOCUMENTS 853960    11/1960  United Kingdom .
1145706   3/1969   United Kingdom .
1283551   7/1972   United Kingdom .
1501403   2/1978   United Kingdom .
1533544   11/1978  United Kingdom .
2065396A  6/1981   United Kingdom .

Primary Examiner—Eugene R. LaRoche
Assistant Examiner—W. R. Paxman
Attorney, Agent, or Firm—James J. Williams; Robert C. Lampe, Jr.

[57] ABSTRACT

Control signals for switching the bandwidth of a filter in a phase locked loop are provided by comparator circuits having time delays at their inputs that vary as a function of the magnitude of changes in the outputs from a phase comparator. These variable time delays permit the comparator circuits to produce an output having a duration of the proper length in order to permit the filter to have a large bandwidth for a long enough time to permit the phase locked loop to become locked.

8 Claims, 3 Drawing Figures

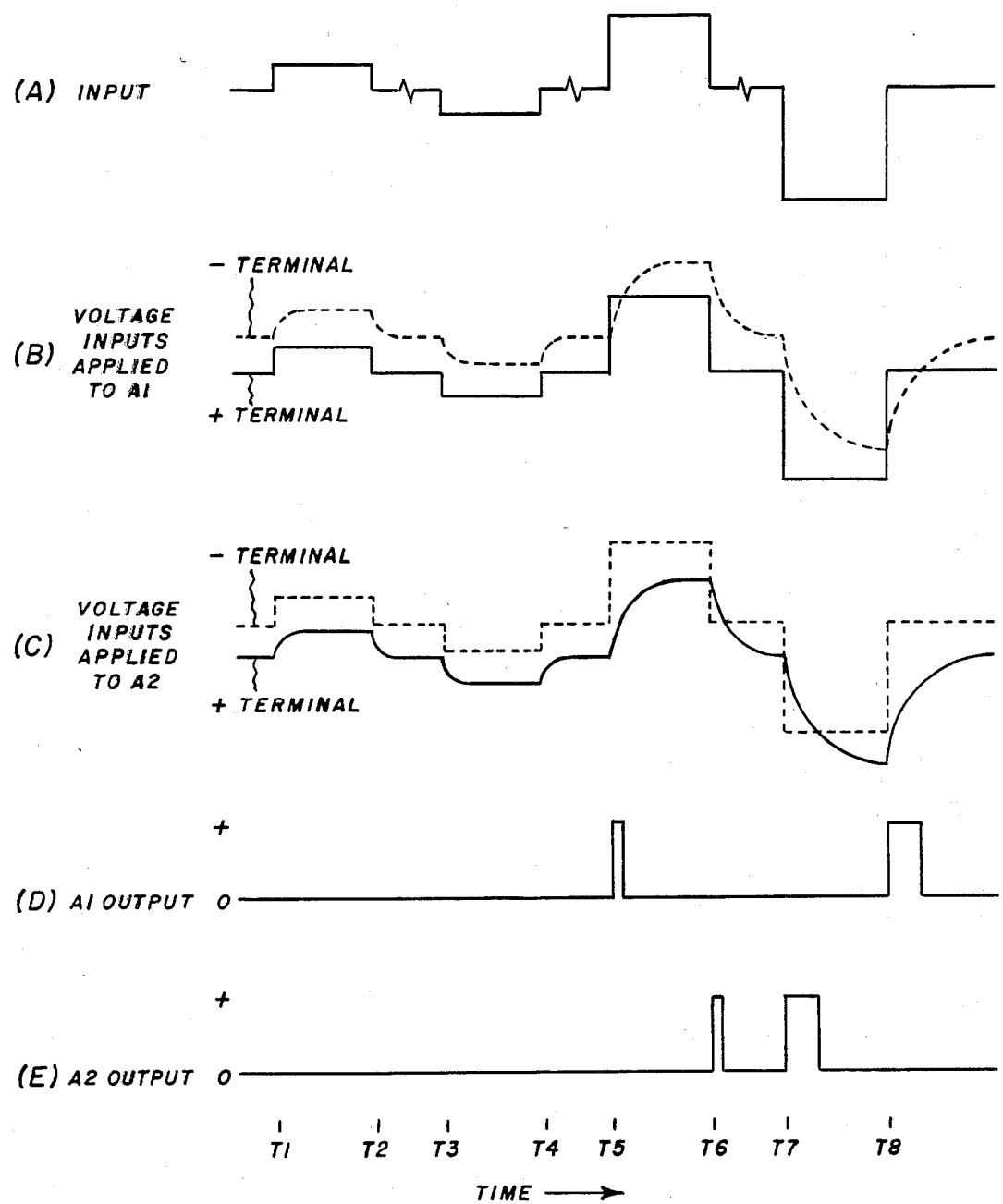

BANDWIDTH CONTROL CIRCUIT FOR A PHASE LOCKED LOOP

BACKGROUND OF THE INVENTION

My invention relates to a control circuit for phase locked loops, and particularly to a bandwidth control circuit for phase locked loops used in a frequency synthesizer.

Phase locked loops are used in frequency synthesizers to provide a relatively wide range of selectable frequencies having the stability of a reference oscillator which is typically crystal controlled. Such a wide frequency range requires that the filter in the phase locked loop have a variable bandwidth so that when a frequency change is programmed or required, such a change can be made in a small amount of time. The rate of change depends on the loop control voltage, which in turn is limited first by the amount of loop gain available. Second, the loop control voltage is further limited when a relatively low cutoff frequency filter is inserted into the phase locked loop control line to reduce noise and frequency modulation of the voltage controlled oscillator by the reference frequency. In prior art circuits of which I am aware, most filter switching in a phase locked loop has been accomplished by using a fixed timing circuit (such as a one shot multivibrator) which initially allows locking with a relatively high filter bandwidth. After the timing circuit times out, it switches the filter to a relatively low bandwidth. However, there are several problems associated with such a timing circuit. First, if for some reason the voltage controlled oscillator goes out of lock because of a noise burst or pulse from the power supply voltage, the normal lock detector might not detect the loss of lock for many milliseconds, so that a transmitter whose frequency source is the voltage controlled oscillator might produce a carrier or high level noise over a good portion of the adjacent frequency spectrum. The second problem is that the fixed time allowed for the voltage controlled oscillator to settle to the new commanded frequency may not be long enough for the particular frequency change involved. When the bandwidth is reduced after this fixed time but before the transmitter has settled to the commanded frequency, the transmitter may produce undesired frequencies with associated interference until its frequency is correct.

From an ideal standpoint, relatively fast and wide frequency changes should be made with a relatively wide bandwidth filter circuit in the phase locked loop. After the voltage controlled oscillator produces the new commanded frequency, the filter circuit should provide a relatively narrow bandwidth.

SUMMARY OF THE INVENTION

My invention provides an improved circuit for controlling the bandwidth of a filter in a phase locked loop. My circuit uses the phase detector output signal and produces both a relatively high signal and a relatively low signal from the phase detector output signal. The low signal is compared in a first comparator with the high signal as delayed by a charging circuit; and the high signal is compared in a second comparator with the low signal as delayed by a charging circuit. For increases in the phase detector output, the first comparator produces an output in response to a relatively low signal exceeding the high signal until the high signal charging circuit delay ends. For decreases in the phase detector output, the second comparator produces an output in response to a relatively low signal exceeding the high signal until the low signal charging circuit delay ends. The comparator outputs are combined so that a circuit output is produced in response to and for a duration related to either of the comparator outputs, which in turn are related to the magnitude of the output signals from the phase detector. During its duration, my circuit output can be used to provide a wide bandwidth filter. At the end of my circuit output, the filter bandwidth can be decreased.

DESCRIPTION OF THE DRAWING

The subject matter which I regard as my invention is particularly pointed out and distinctly claimed in the claims. The structure and operation of my invention, as well as advantages, may be better understood from the following description given in connection with the accompanying drawing, in which:

FIG. 3 shows waveforms for illustrating the operation of my control circuit of FIG. 2.

DESCRIPTION OF THE PREFERRED EMBODIMENT

Figure 1:
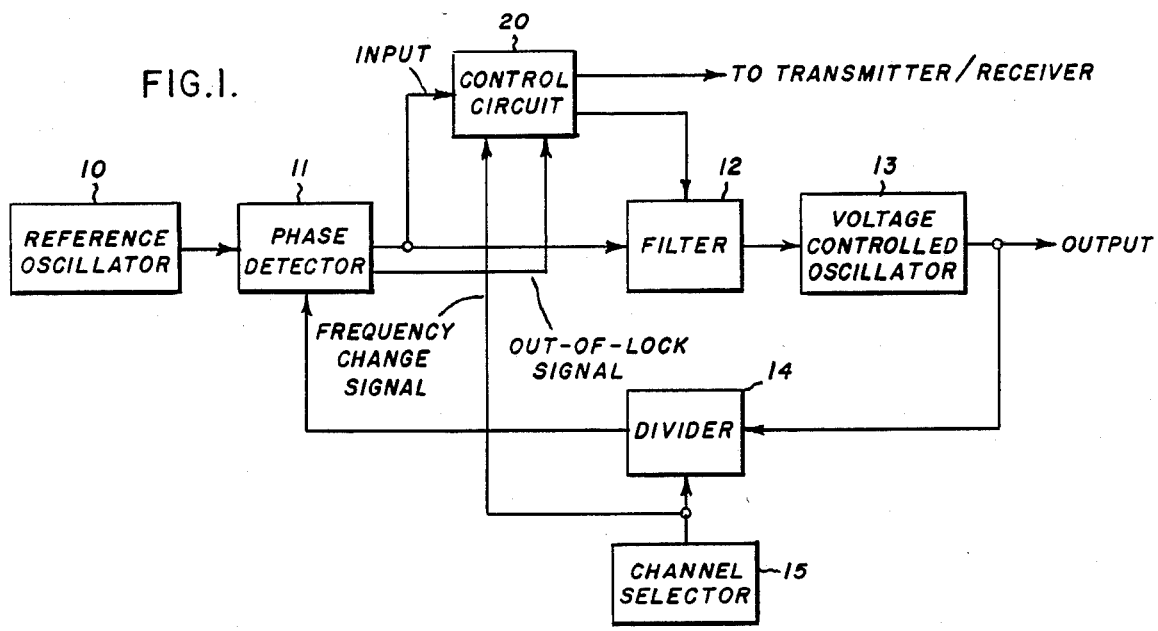
FIG. 1 shows a block diagram of a frequency synthesizer having a phase locked loop and a control circuit in accordance with my invention.

In order to describe my invention, I will first describe the block diagram of FIG. 1 which shows a control circuit in accordance with my invention used with a known frequency synthesizer having a phase locked loop. As known in the art, such a synthesizer may comprise a stable reference oscillator 10 which is normally crystal controlled. The frequency of this oscillator may, if desired, be multiplied up or divided down in frequency after which its output is applied to a first input of a phase detector 11. The output of the phase detector 11 is applied through a filter circuit 12 to the input of a voltage controlled oscillator 13. The output of the oscillator 13 is derived for any suitable use, such as a radio transmitter or receiver. The output of the oscillator 13 may be divided down in frequency or multiplied up in frequency, depending upon the circuit requirements. In the example shown in FIG. 1, I have assumed that the output of the oscillator 13 is divided down in frequency by a divider 14 and applied to a second input of the phase detector 11. As known in the art, a channel selector 15 may be connected to the divider 14 to change the divisor applied to the output signals from the oscillator 13, and thus change the output from the oscillator 13 as provided by the phase locked loop.

The circuit as described thus far is known in the art. As mentioned earlier, if the channel selector 15 is switched rapidly or causes the divider 14 to change the divisor by a relatively large magnitude, the phase locked loop may require considerable time in order to achieve lock and cause the voltage controlled oscillator 13 to produce the new desired output frequency. This is particularly true if the filter 12 has a relatively narrow bandwidth, a condition normally required to reduce noise or spurious radiations from the oscillator 13. And during the time that the phase locked loop is out of lock, the oscillator 13 may and frequently does produce undesired and widely varying output frequencies. In order to reduce these undesired effects, I provide a control circuit 20 which, in accordance with my invention, receives an output from the phase detector 11 and supplies this output to the filter 12 to cause the filter 12 to switch bandwidths in accordance with the operation of my control circuit 20. As will be explained in detail, my control circuit 20 produces a first output in response to a relatively low output from the phase detector 11. This first output may be used to cause the filter 12 to have a relatively narrow bandwidth, and hence reduce noise and other undesired radiations from the oscillator 13. My control circuit 20 produces a second output in response to a relatively high output from the phase detector 11 until this high output decreases to the previously mentioned low output. The second output from my control circuit 20 may be used to cause the filter 12 to have a relatively wide bandwidth, and thus permit rapid lock of the phase locked loop to be obtained. My control circuit 20 may also be supplied with a frequency change signal which may be derived from the channel selector 15, and with an out-of-lock signal which may be derived from the phase detector 11. These signals permit my control circuit 20 to produce the second output signal which may be used to cause the filter 12 to have a wide bandwidth. An output may also be derived from my control circuit 20 for application to a transmitter and/or receiver for momentarily cutting these devices off during the time the second output is produced.

Figure 2:
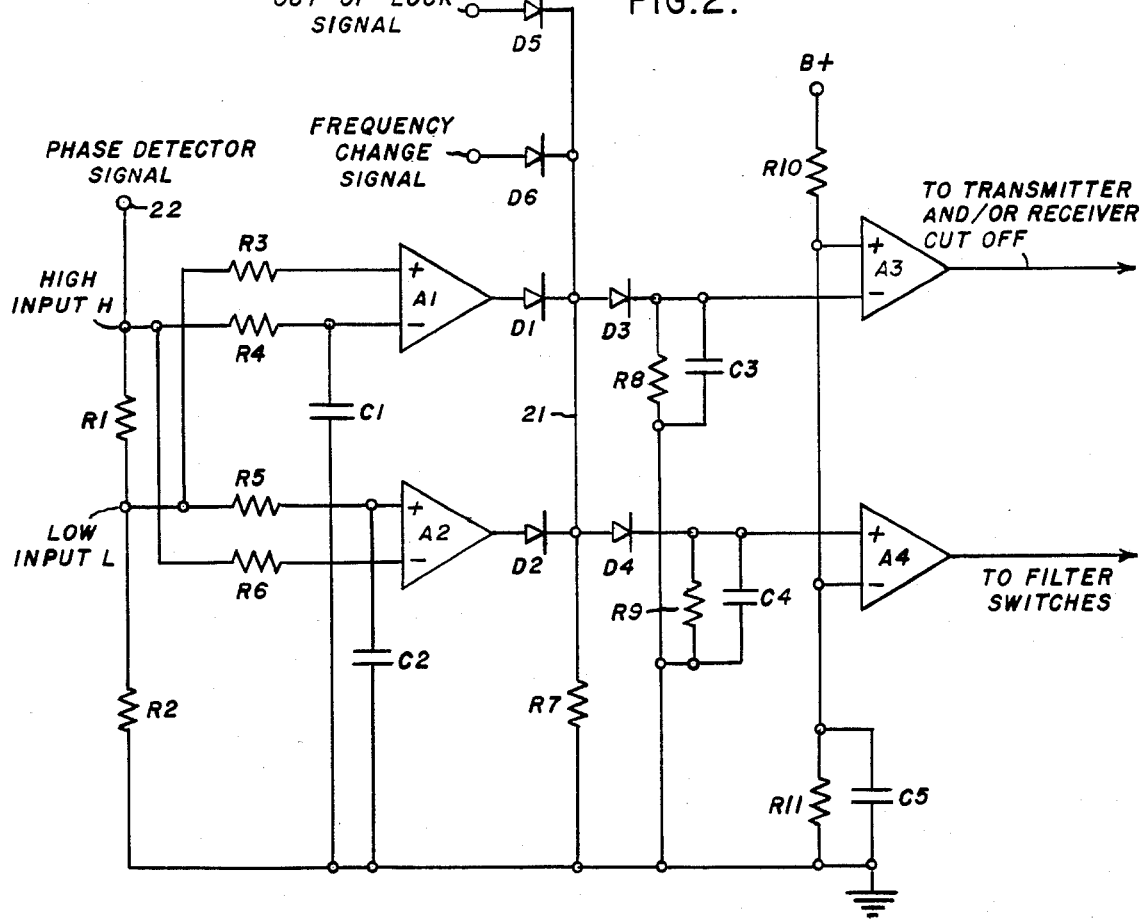
FIG. 2 shows a schematic diagram of a preferred embodiment of my control circuit.

FIG. 2 shows a schematic diagram of a preferred embodiment of my control circuit 20 of FIG. 1. Signals from the phase detector 11 are applied to a voltage divider comprised of resistors R1, R2 connected in series between an input terminal 22 and a point of reference potential, such as ground. This voltage divider causes the phase detector signal to have a relatively high input at the terminal H, and a relatively low input at the terminal L. The high input terminal H is coupled through a resistor R4 to the minus input of an operational amplifier A1 connected as a comparator circuit, and through a resistor R6 to the minus input of an operational amplifier A2 also connected as a comparator circuit. The low input terminal L is coupled through a resistor R3 to the plus input of the amplifier A1, and through a resistor R5 to the plus input of the amplifier A2. Capacitor C1 is connected between the minus input of the amplifier A1 and ground and, with resistor R4, comprises a delay circuit for amplifier A1. Similarly, capacitor C2 is connected between the plus input of the amplifier A2 and ground and, with resistor R6, comprises a delay circuit for amplifier A2. These delay circuits provide a time delay for reasons that will be explained. The outputs of the amplifiers A1, A2 are coupled through isolating diodes D1, D2 to a common output bus 21. The output bus 21 is coupled through an isolating diode D3 to the minus input of an operational amplifier A3 connected as a comparator circuit, and through an isolating diode D4 to the plus input of an operational amplifier A4 also connected as a comparator circuit. A voltage reference circuit is provided by resistors R10, R11 connected in series between a voltage B+ and ground. The plus input of the amplifier A3 and the minus input of the amplifier A4 are connected to the junction of the resistors R10, R11. Also, a filter circuit comprising a resistor R8 and a capacitor C3 is connected between the minus input of the amplifier A3 and ground, and a filter circuit comprising a resistor R9 and capacitor C4 is coupled between the plus input of the amplifier A4 and ground. And finally, the out-of-lock signal is connected through a diode D5 to the common output bus 21, and the frequency change signal is coupled through an isolating diode D6 to the common output bus 21.

The output of the amplifier A3 can be applied to the transmitter and/or receiver for cutting these devices off, and the output of the amplifier A4 can be connected to the filter 12 for changing its characteristics. The outputs of the amplifiers A1, A2 are applied to the minus terminal of the amplifier A3 and the plus terminal of the amplifier A4. Normally, the amplifier A3 produces an output because its plus terminal is supplied with a positive voltage by the resistor R10. Thus, elimination of the output of the amplifier A3 can be used to cut off either the radio transmitter or the radio receiver, or both if desired. Normally, the amplifier A4 produces no output because its minus terminal is supplied with a positive voltage by the resistor R10. When the amplifier A4 produces no output, this can be used to cause the filter 12 to have a relatively narrow bandwidth. However, when the amplifier A4 produces an output, this can be used to cause the filter 12 to have a relatively wide bandwidth. Such bandwidth can be accomplished in any number of known ways, such as connecting or disconnecting capacitors in the filter circuit.

The operation of my circuit of FIG. 2 will be explained in connection with the waveforms plotted along a common time axis in FIG. 3. FIG. 3A shows the input signal applied to my circuit from the phase detector 11. FIG. 3B shows the inputs applied to the amplifier A1, the dashed line representing the input to the minus terminal and the solid line representing the input to the plus terminal. FIG. 3C shows the inputs applied to the amplifier A2, the dashed line representing the input to the minus input, and the solid line representing the input to the plus input. FIG. 3D shows the output of the amplifier A1, and FIG. 3E shows the output of the amplifier A2.

Prior to the time T1, I have assumed that the input to my circuit as shown in FIG. 3A is at its stable or normal value. With this normal input, the minus terminal input of the amplifier A1 exceeds the plus terminal input of the amplifier A1 so that the amplifier A1 produces no output. Likewise, the minus terminal input of the amplifier A2 exceeds the plus terminal input of the amplifier A2 so that the amplifier A2 produces no output. With no outputs from the amplifiers A1, A2, and with no out-of-lock and frequency change signals, the amplifier A3 provides an output that can be used to keep a transmitter and/or receiver turned on; and the amplifier A4 provides no output that can be used to cause the filter 12 to have a broad bandwidth. At the time T1, I assume that the input rises by a relatively small magnitude in response to a phase difference of the reference and controlled oscillator signals. This causes the plus terminal of the amplifier A1 and the minus terminal of the amplifier A2 to increase in the same manner. The minus terminal of the amplifier A1 and the plus terminal of the amplifier A2 also increase, but more slowly because the capacitors C1, C2 must be charged. But because of the small rise in the input, the minus terminal of the amplifier A1 stays above its plus terminal. The minus terminal of the amplifier A2 clearly stays above its plus terminal. As a result, neither amplifier produces an output at the time T1 as shown in FIGS. 3D and 3E. At the time T2, the input falls to its initial and stable value. The plus terminal of the amplifier A1 and the minus terminal of the amplifier A2 decrease similarly, while the minus terminal of the amplifier A1 and the plus terminal of the amplifier A2 decreases slowly because the capacitors C1, C2 must discharge. However, because of the small decrease, the minus terminals stay above the respective plus terminals so that no amplifier outputs are produced.

At the time T3, I assume that the input decreases a small amount below its normal value. This causes the amplifier terminals to decrease in the manner described at the time T2. In this case, the minus terminals continue to remain above the respective plus terminals, so that no amplifier outputs are produced. At the time T4, I assume that the input rises up to its normal or stable value again. This causes the inputs to the amplifiers A1, A2 to follow a similar variation as described for the time T1. Again, no amplifier outputs are produced.

However, at the time T5, I assume that the input increases by a relatively large amount, at least above a threshold set by the circuit values. Such a large increase would reflect a large phase difference between the reference and controlled oscillator signals. This causes the plus terminal of the amplifier A1 to rise above the minus terminal of the amplifier A1 because an increase of the minus terminal is delayed by the capacitor C1 having to charge. During the time required for the capacitor C1 to become charged and the minus terminal voltage to exceed the plus terminal voltage of the amplifier A1, the amplifier A1 produces a plus output at the time T5 as shown in FIG. 3D. However, the amplifier A2 produces no output because the minus input exceeds the plus input as shown in FIG. 3C. This output from the amplifier A1 causes the amplifier A3 to produce an output that could turn the transmitter and receiver off; and causes the amplifier A4 to produce an output that causes the filter 12 to have a wide bandwidth.

At the time T6, I assume that the input decreases rapidly to its normal value as shown in FIG. 3A. The amplifier A1 produces no output, as the plus terminal remains below the minus terminal. However, the minus terminal of the amplifier A2 decreases rapidly below the plus terminal, because the plus terminal must discharge through the capacitor C2. During this discharge time, the amplifier A2 produces an output as shown in FIG. 3E. This output from the amplifier A2 causes the amplifier A3 to produce an output that could turn the transmitter and receiver off; and causes the amplifier A4 to produce an output that causes the filter 12 to have a wide bandwidth.

At the time T7, I assume that the input decreases rapidly to a lower value as shown in FIG. 3A. This causes the amplifier A2 to produce an output at the time T7 in the same manner described for the operation at the time T6. Because the magnitude of the decrease at the time T7 is greater than the magnitude of the decrease at the time T6, the time delay is greater, and the duration of the output at the time T7 is greater than the duration of the output at the time T6.

And finally, at the time T8, I assume that the input rises rapidly to its normal value as shown in FIG. 3A. This causes the amplifier A1 to produce an output and the amplifier A2 to produce no output as described for the operation at the time T5. Because the magnitude of the increase at the time T8 is greater than the magnitude of the increase at the time T5, the time delay is greater, and the duration of the output at the time T8 is greater than the duration of the output at the time T5.

While other input changes would cause other durations of outputs, persons skilled in the art will understand the operation of my circuit from the examples given and explained in connection with FIG. 3.

The out-of-lock and frequency change signals applied through the isolating diodes D5, D6 can also be applied to the minus terminal of the amplifier A3 and the plus terminal of the amplifier A4 to achieve the same functions as outputs from the amplifiers A1, A2. Thus, an out of lock signal or a frequency change signal could cause the amplifier A3 to eliminate its output and cause the amplifier A4 to provide an output for the functions described previously.

It will thus be seen that I have provided a new and improved control circuit for use in a phase locked loop for the purpose of providing a control signal which has a duration dependent upon the magnitude of change of the phase detector input signal. While I have described only one embodiment of my invention, persons skilled in the art will appreciate the modifications that may be made. The comparator circuits provided by the amplifiers A1, A2, A3, A4 may take many forms, although I do prefer operational amplifiers. And, delay circuits provided by the capacitors C1, C2 may also take other forms, and provide time delays dependent upon circuit requirements. Therefore, while my invention has been described with reference to a particular embodiment, it is to be understood that modifications may be made without departing from the spirit of the invention or from the scope of the claims.

What I claim as new and desire to secure by Letters Patent of the United States is:

1. A control circuit for a phase locked loop having a reference oscillator, a controlled oscillator, a phase detector having inputs coupled to said oscillators, and a filter coupled between an output of said phase detector and a control input of said controlled oscillator, said control circuit comprising:
   a. an input circuit having an output that produces a high voltage and an output that produces a low voltage, relative to each other, each being proportional to the voltage at said phase detector output;
   b. first and second comparator circuits each having first and second inputs and an output;
   c. means coupling said first input of said first comparator circuit to said low voltage output of said input circuit;
   d. means coupling said second input of said second comparator circuit to said high voltage output of said input circuit;
   e. a first delay circuit coupling said second input of said first comparator circuit to said high voltage output of said input circuit;
   f. a second delay circuit coupling said first input of said second comparator circuit to said low voltage output of said input circuit;
   g. and output means coupled to said outputs of both of said first and second comparator circuits for producing a control signal for application of said filter.

2. The control circuit of claim 1 wherein said output means include a comparator circuit having a first input coupled to said outputs of said first and second comparator circuits, and having a second input coupled to a reference voltage.

3. The control circuit of claim 1 or claim 2 wherein each of said delay circuits comprise a capacitor charging circuit.

4. A phase locked loop control circuit comprising:

a. a voltage divider circuit for coupling to a phase detector output and for providing a relatively high voltage proportional to said phase detector output and for providing a relatively low voltage proportional to said phase detector output;

b. first and second comparator circuits each having first and second inputs and an output, said output having a first magnitude in response to said first input exceeding said second input and having a second magnitude in response to said second input exceeding said first input;

c. means coupling said low voltage output of said voltage divider circuit to said first input of said first comparator circuit;

d. means coupling said high voltage output of said voltage divider circuit to said second input of said second comparator circuit;

e. a first time delay circuit coupling said second input of said first comparator circuit to said high voltage output of said voltage divider circuit;

f. a second time delay circuit coupling said first input of said second comparator circuit to said low voltage output of said voltage divider circuit;

g. and means combining said outputs of said first and second comparator circuits for controlling a filter circuit in said phase locked loop circuit.

5. The control circuit of claim 4 wherein said comparator circuits comprise operational amplifiers.

6. The control circuit of claim 4 or claim 5 wherein said combining means comprise a threshold circuit that produces an output in response to either of said comparator circuit outputs exceeding a selected magnitude.

7. The control circuit of claim 4 or claim 5 wherein said time delay circuits introduce a time delay to changes in said high voltage output of said voltage divider circuit, said time delay being a function of the amount of said changes in signal level.

8. The control circuit of claim 6 wherein said time delay circuits introduce a time delay to changes in said high voltage output of said voltage divider circuit, said time delay being a function of the amount of said changes in signal level.

* * * * *